(12) United States Patent
Lien et al.

(10) Patent No.: US 12,189,961 B2
(45) Date of Patent: Jan. 7, 2025

(54) CHARGE LOSS MITIGATION THROUGH DYNAMIC PROGRAMMING SEQUENCE

(71) Applicant: MICRON TECHNOLOGY, INC., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 17/889,873

(22) Filed: Aug. 17, 2022

(65) Prior Publication Data

US 2024/0061588 A1 Feb. 22, 2024

(51) Int. Cl.
G06F 12/00 (2006.01)
G06F 3/06 (2006.01)

(52) U.S. Cl.
CPC .......... G06F 3/0619 (2013.01); G06F 3/0644 (2013.01); G06F 3/0679 (2013.01)

(58) Field of Classification Search
CPC ....... G06F 3/0619; G06F 3/0644; G06F 3/067
See application file for complete search history.

(56) References Cited

U.S. PATENT DOCUMENTS

| | | | | |
|---|---|---|---|---|
| 2011/0066902 A1* | 3/2011 | Sharon | ................... | G11C 29/52 714/E11.034 |
| 2015/0348649 A1* | 12/2015 | Yang | ...................... | G11C 29/52 714/723 |
| 2016/0148702 A1* | 5/2016 | Karakulak | ........... | G11C 29/021 365/185.11 |
| 2018/0188981 A1* | 7/2018 | Alavi | .................... | G11C 16/349 |
| 2019/0198069 A1* | 6/2019 | Kale | ....................... | G11C 29/36 |
| 2020/0027503 A1* | 1/2020 | Chen | ..................... | G06F 3/0632 |
| 2020/0210831 A1* | 7/2020 | Zhang | ...................... | G06N 3/08 |
| 2021/0264988 A1* | 8/2021 | Kavalipurapu | .... | G11C 16/0483 |
| 2022/0005535 A1* | 1/2022 | Kim | .................... | G11C 16/3427 |
| 2022/0300186 A1* | 9/2022 | Muchherla | ............... | G11C 7/04 |
| 2022/0319630 A1* | 10/2022 | Sheperek | ............ | G11C 11/5642 |
| 2022/0383970 A1* | 12/2022 | Zuolo | ................... | G11C 29/021 |
| 2023/0044991 A1* | 2/2023 | Rajwade | ............... | G06F 3/0679 |

(Continued)

OTHER PUBLICATIONS

Program/Erase Cycling Enhanced Lateral Charge Diffusion in Triple-level Cell Charge-trapping 3D NAND Flash Memory. Rui Cao, Jixuan Wu, Wenjing Yang, Jiezhi Chen# School of Information Science and Engineering, Shandong University Qingdao, P. R. China 2019.*

(Continued)

*Primary Examiner* — David Yi
*Assistant Examiner* — Tahilba O Puche
(74) *Attorney, Agent, or Firm* — Lowenstein Sandler LLP

(57) ABSTRACT

A program command specifying new data to be programmed is received and partitioned into a plurality of data partitions. A wordline addressing a first set of memory cells to be programmed with a data partition of the plurality of data partitions is identified for a specified block of the memory device. Existing data stored by a second set of memory cells is read. An expected data state metrics is produced for each data partition of the plurality of data partitions. A data partition associated with a lowest expected data state metric among the plurality of expected data state metrics is identified. The identified data partition is programmed to the identified wordline.

20 Claims, 7 Drawing Sheets

(56) References Cited

U.S. PATENT DOCUMENTS

| | | | | |
|---|---|---|---|---|
| 2023/0207017 A1* | 6/2023 | Oh | ........................ | G11C 16/32 365/189.011 |
| 2023/0214291 A1* | 7/2023 | Muthiah | ............... | G06F 3/0679 714/764 |

OTHER PUBLICATIONS

Retention Correlated Read Disturb Errors in 3-D Charge Trap NAND Flash Memory: Observations, Analysis, and Solutions Yachen Kong, Meng Zhang, Xuepeng Zhan, Rui Cao, and Jiezhi Chen, Senior Member, IEEE. 2020.*

Lateral charge migration induced abnormal read disturb in 3D charge-trapping NAND flash memory To cite this article: Fei Wang et al 2020 Applied Physics Express.*

Mizoguchi et al., "Lateral Charge Migration Suppression of 3D-NAND Flash by VTH Nearing for Near Data Computing," 2017 IEEE, IEDM17-465, 19.2.1-19.2.4.

* cited by examiner

US 12,189,961 B2

CHARGE LOSS MITIGATION THROUGH DYNAMIC PROGRAMMING SEQUENCE

TECHNICAL FIELD

Embodiments of the disclosure relate generally to memory sub-systems, and more specifically, relate to charge loss mitigation through dynamic programming sequence.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
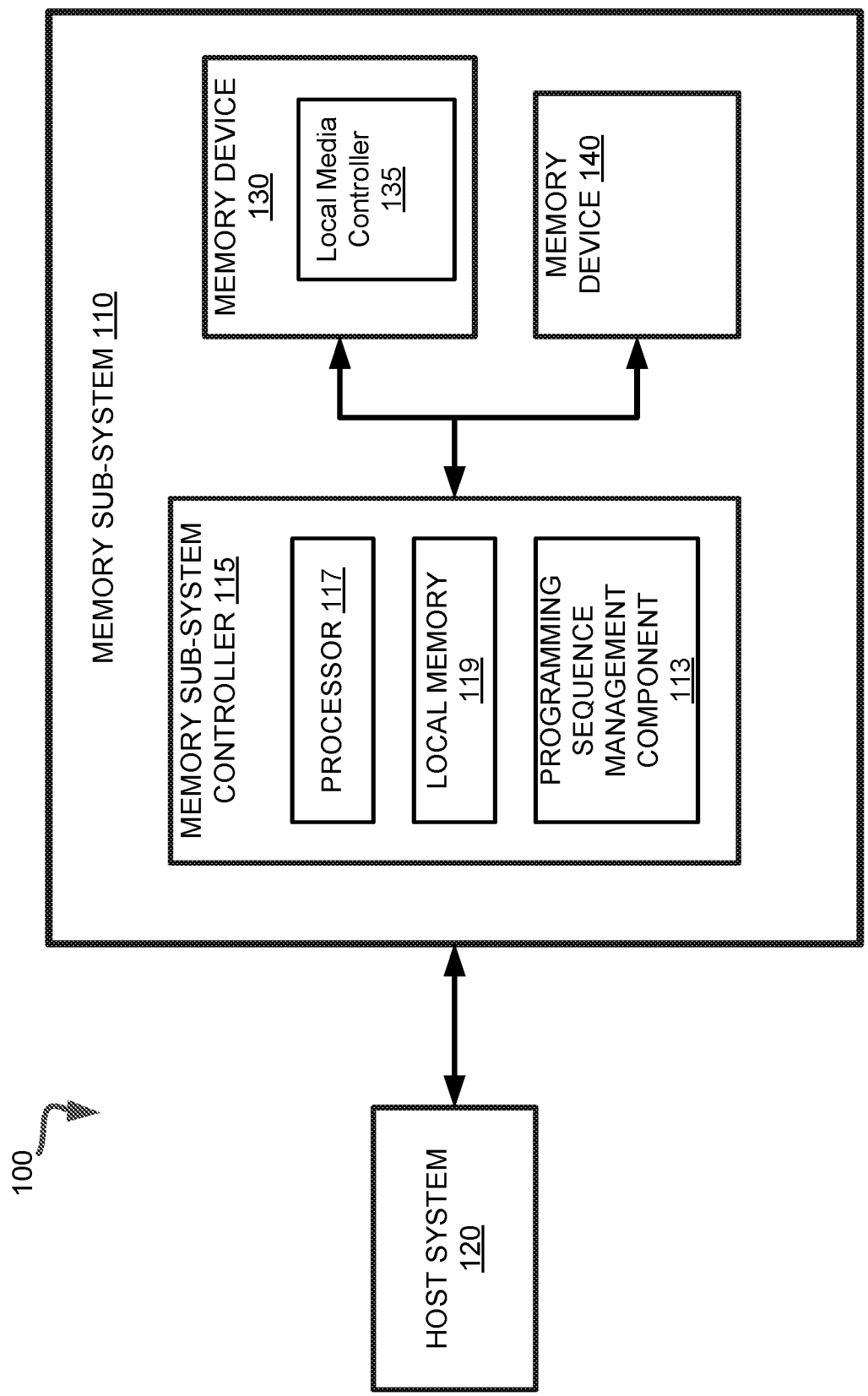
FIG. 1 illustrates an example computing system that includes a memory sub-system in accordance with some embodiments of the present disclosure.

Aspects of the present disclosure are directed to charge loss mitigation through a dynamic programming sequence. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can includes one or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells. Depending on the cell type, a cell can store one or more bits of binary information, and has various logic states that correlate to the number of bits being stored. The logic states can be represented by binary values, such as "0" and "1", or combinations of such values.

A memory device can be a non-volatile memory device. A non-volatile memory device is a package of one or more dice. Each die can include one or more planes. Planes can be grouped into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. A data block is a unit of the memory device that includes a set of memory cells interconnected by multiple wordlines of, a wordline group. A block can be divided into multiple pages.

Each data block can include a number of sub-blocks, where each sub-block is defined by an associated pillar (e.g., a vertical conductive line) extending from a shared bitline. Since the sub-blocks can be accessed separately (e.g., to perform program or read operations), the data block can include a structure to selectively enable the pillar associated with a certain sub-block, while disabling the pillars associated with other sub-blocks. In one embodiment, this structure includes one or more select gate devices positioned at either or both ends of each pillar. Depending on a control signal applied, these select gate devices can either enable or disable the conduction of signals through the pillars. In one embodiment, the select gates devices associated with each pillar in the data block are controlled separately.

Some memory devices can implement these select gate devices using floating gate transistors having a relatively long channel that provides good signal isolation when in the appropriate state. Other memory devices, however, can implement these select gate devices using replacement gate transistors which have a relatively short channel. The replacement gate transistors are programmable devices and thus offer the benefit of more versatility, but are susceptible to some amount of signal leakage. In addition, the programmable threshold voltage of replacement gate transistors can shift over time. While initially set at a certain target value, numerous factors including a number of program/erase cycles performed on the device, temperature changes, etc., can cause the threshold voltage of the select gate device to increase or decrease over time. This shift away from the target value can lead to charge loss (e.g., lateral charge loss), causing the select gate device to function improperly and potentially causing reliability problems in the data stored on the wordlines of the corresponding sub-block.

Depending on the variation of stored memory cell charges between adjacent wordlines, an electrical field of the memory cells could drive the stored electrons from high concentration to low concentration and/or into the spacing between wordlines. This redistribution of stored electrons may result in a downshift for high voltage states and an upshift for low voltage states (e.g., lateral charge loss).

Aspects of the present disclosure mitigate the lateral charge loss and address other deficiencies by re-ordering the host data to be programmed by a memory device in a manner that would minimize the expected data state metric (e.g., a bit error rate) exhibited by the memory pages storing the host data. In an illustrative example, upon receiving a program command specifying the host data to be programmed, the memory sub-system controller may split the host data into a sequence of data partitions of a predefined size (e.g., corresponding to a multiple of the page size). The controller may then identify one or more blocks to be programmed with the host data. Iterating through the blocks, the controller may identify, for each block, the wordline addressing the next set of memory cells to be programmed (i.e., the first erased page). The controller may then read the existing data stored by the set of memory cells addressable by the adjacent wordline (e.g., the preceding wordline) of the identified wordline, since it is the data programmed in the preceding wordline that would be interfering with the data to be programmed into the identified wordline. In order to minimize the undesirable effects of such interference, the controller may select a data partition to be programmed into the identified wordline.

In some implementations, the controller may utilize a pre-computed lateral charge loss table that reflects the lateral charge loss caused by the adjacent wordline (e.g., the preceding wordline $WL_{n-1}$ of a specified wordline $W_{Ln}$). In such a table, the rows and columns correspond to the possible programmed states (e.g., L0 to L7) of two adjacent wordlines (e.g., the rows correspond to the possible programmed state of a specified wordline $W_{Ln}$ and the columns correspond to the possible programmed state of the preceding wordline $WL_{n-1}$, or vice versa). Thus, each cell of the table identified by the intersection of a row and a column would store the value of the expected data state metric that would be exhibited by the memory cell of the specified wordline if the memory cell is programmed to the programmed state identified by the index of the row and if the adjacent memory cell (on the adjacent wordline) is programmed to the programmed state identified by the index of the column.

In some implementations, the controller may utilize a pre-computed lateral charge loss table that reflects the lateral charge loss caused by the two adjacent wordlines (e.g., the preceding wordline $WL_{n-1}$ of a specified wordline $W_{Ln}$ and the subsequent wordline $WL_{n-1}$ of the specified wordline $W_{Ln}$). Such a table may be implemented as a three-dimensional table, in which the first dimension corresponds to the possible programmed state of the specified wordline $W_{Ln}$, the second dimension corresponds to the possible programmed state of the preceding wordline $WL_{n-1}$, and the third dimension corresponds to the possible programmed state of the subsequent wordline $WL_{n+1}$. Thus, each cell of the table identified by three indices would store the value of the expected data state metric that would be exhibited by the memory cell of the specified wordline if the memory cell is programmed to the programmed state identified by the first index, the first adjacent memory cell (on the preceding wordline) is programmed to the programmed state identified by the second index, and the second adjacent memory cell (on the subsequent wordline) is programmed to the programmed state identified by the third index of the cell. While the present description refers to a three-dimensional table, such a table may be simulated by various data structures, including two-dimensional tables.

Using the lateral charge loss mitigation table, the controller may predict, for a given data partitions of the host data, the expected data state metrics to be exhibited by the set of memory cells addressable by the identified wordline if the set of memory cells if programmed with the given data partition, by summing up the expected data state metrics to be exhibited by each memory cell of set of memory cells. Accordingly, the controller may choose, among the data partitions of the host data to be programmed, the data partition that, if programmed into the memory cells addressable by the identified wordline, would exhibit the lowest expected data state metric among all data partitions of the host data. In order to facilitate a subsequent read command, the programming sequence of the host data partitions may be stored in a metadata area of the memory device, as described in more detail herein below.

Advantages of the present disclosure include, but are not limited to, mitigating the lateral charge loss, thereby resulting in reduction of the total data state metric. The reduction of the total data state metric extends data retention and reduces the use of error correction codes to rescue data.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a programming sequence management component 113 that can re-order host data to be programmed in a manner that would minimize the expected data state metric exhibited by the memory pages due to charge loss. In some embodiments, the memory sub-system controller 115 includes at least a portion of the programming sequence management component 113. In some embodiments, the programming sequence management component 113 is part of the host system 110, an application, or an operating system. In other embodiments, local media controller 135 includes at least a portion of programming sequence management component 113 and is configured to perform the functionality described herein.

The programming sequence management component 113 may receive a program command specifying host data to be programmed by the memory device 130 and/or 140. The programming sequence management component 113 may partition (e.g., split) the host data into a plurality of data partitions having a predefined size. Depending on the embodiment, the predefined size may correspond to a multiple of the page size. In an illustrative example, the host data may be split into 8 data partitions or 32 data partitions. Accordingly, the programming sequence management component 113 may systematically re-order the plurality of data partitions across a plurality of blocks distributed across memory device 130 and/or 140 to minimize the expected data state metric exhibited by the memory pages storing the host data. The programming sequence management component 113 identifies one or more blocks to be programmed with the plurality of data partitions of the host data. In one embodiment, the one or more blocks may be sequentially ordered. In another embodiment, the one or more blocks may be ordered for weakest to strongest (i.e., ordered from the blocks with less endurance and capability to the blocks more endurance and capability).

The programming sequence management component 113 iterates through the blocks and identifies, for each block, the wordline addressing the next set of memory cells to be programmed (i.e., the first erased page or empty page). Responsive to determining that each block is empty, the programming sequence management component 113 programs, one by one, each data partition of the plurality of data partitions sequentially to each of the blocks. In some embodiments, the programming sequence management component 113 may determine that the blocks are not empty, i.e., that at least one set of memory cells (addressable by a wordline) of each of the blocks contains data. The programming sequence management component 113 may then iterate through the blocks and identify, for each block, the wordline of a respective block addressing the next set of memory cells of the respective block to be programmed (i.e., the wordline addressing an erased page or empty page). The programming sequence management component 113 may then read the existing data stored by an adjacent set of memory cells of the respective block addressable by the adjacent wordline of the respective block (e.g., the preceding wordline) of the identified wordline. Responsive to reading the existing data from the preceding wordline, the programming sequence management component 113 obtains a plurality of threshold voltages associated with reading the preceding wordline of the respective block (e.g., the plurality of preceding wordline threshold voltages). The programming sequence management component 113, for each data partition of the plurality of consecutive data partitions, determines a plurality of threshold voltages necessary to program a respective data partition (e.g., the plurality of respective data partition threshold voltages).

The programming sequence management component 113 may then utilize a pre-computed lateral charge loss table to obtain an expected data state metric exhibited by each memory cell on the identified wordline if the identified wordline is programmed with the respective data partition and the adjacent wordline previously programmed with existing data.

The pre-computed lateral charge loss table may be stored in the local memory 119 of the memory sub-system controller 115. The pre-computed lateral charge loss table includes a plurality of rows and a plurality of columns. The plurality of rows and the plurality of columns correspond to the possible programmed states (e.g., L0 to L7) of two adjacent wordlines (e.g., the plurality of rows correspond to the possible programmed state of a specified wordline $W_{Ln}$ (e.g., the identified wordline) and the plurality of columns correspond to the possible programmed state of the preceding wordline $WL_{n-1}$ (e.g., the preceding wordline), or vice versa). Thus, each cell (or entry) of the table identified by the intersection of a row of the plurality of rows and a column of the plurality of columns stores a value of the expected data state metric that would be exhibited by the memory cell of the identified wordline if the memory cell is programmed to the programmed state identified by the index of the row and if the adjacent memory cell (on the adjacent wordline) is programmed to the programmed state identified by the index of the column.

In some embodiments, the pre-computed lateral charge loss table may be a three-dimensional table, in which the first dimension corresponds to the possible programmed state of the specified wordline $W_{Ln}$, the second dimension corresponds to the possible programmed state of the preceding wordline $WL_{n-1}$, and the third dimension corresponds to the possible programmed state of the subsequent wordline $WL_{n+1}$. Thus, each cell of the table identified by three indices would store the value of the expected data state metric that would be exhibited by the memory cell of the specified wordline if the memory cell is programmed to the programmed state identified by the first index, the first adjacent memory cell (on the preceding wordline) is programmed to the programmed state identified by the second index, and the second adjacent memory cell (on the subsequent wordline) is programmed to the programmed state identified by the third index of the cell.

The programming sequence management component 113, using the pre-computed lateral charge loss table, for each data partition, predicts a total expected data state metric to be exhibited by the set of memory cells addressable by the identified wordline if the set of memory cells if programmed with the respective data partition by summing up each expected data state metric to be exhibited by each memory cell of set of memory cells addressable by the identified wordline. The programming sequence management component 113 may then compare a total expected data state metric of each of the plurality of data partitions to identify a data partition that exhibits the lowest total expected data state metric among all data partitions of the plurality of data partitions. Accordingly, the programming sequence management component 113 may program the identified data partition of the plurality of data partition to the identified wordline of the respective block before iterating to a next block of the blocks.

Responsive to programming the identified data partition of the plurality of data partitions to the respective block, the programming sequence management component 113 stores, in an entry of a programming sequence table stored by the memory sub-system controller 115 (e.g., in the local memory 119), a block identification associated with the respective block. The block identification indicates a LUN and a plane in which the respective block is located. The rows of the programing sequence table correspond to the wordlines addressing respective sets of the memory cells (e.g., pages). The columns of the programming sequence tables correspond to the partition identifiers identifying respective data partitions. Depending on the embodiment, the rows and the columns of the programming sequence table may be swapped. Thus, each entry (or cell) of the programming sequence table identified by an intersection of a row and a column stores the identifier of the block in which the data partition identified by the column index is stored, and the data partition belongs to a sequence of data partitions that is stored in the set of memory cells addressable by the wordline identified by the row index.

The programming sequence management component 113, in response to receiving a read command directed to reading data from a specific wordline of the plurality of blocks, determines whether the specific wordline is a first wordline of the plurality of blocks. Responsive to determining that the specific wordline is the first wordline, the programming sequence management component 113 reads the specific wordline of each block of the plurality of blocks sequentially.

Responsive to determining that the specific wordline is not the first wordline, the programming sequence management component 113, identifies the row of the programming sequence table that corresponds to the specific wordline, and then sequentially reads the blocks identified by the entries of the identified table row. Further details with regards to the operations of the programming sequence management component 113 are described below.

Figure 2A:
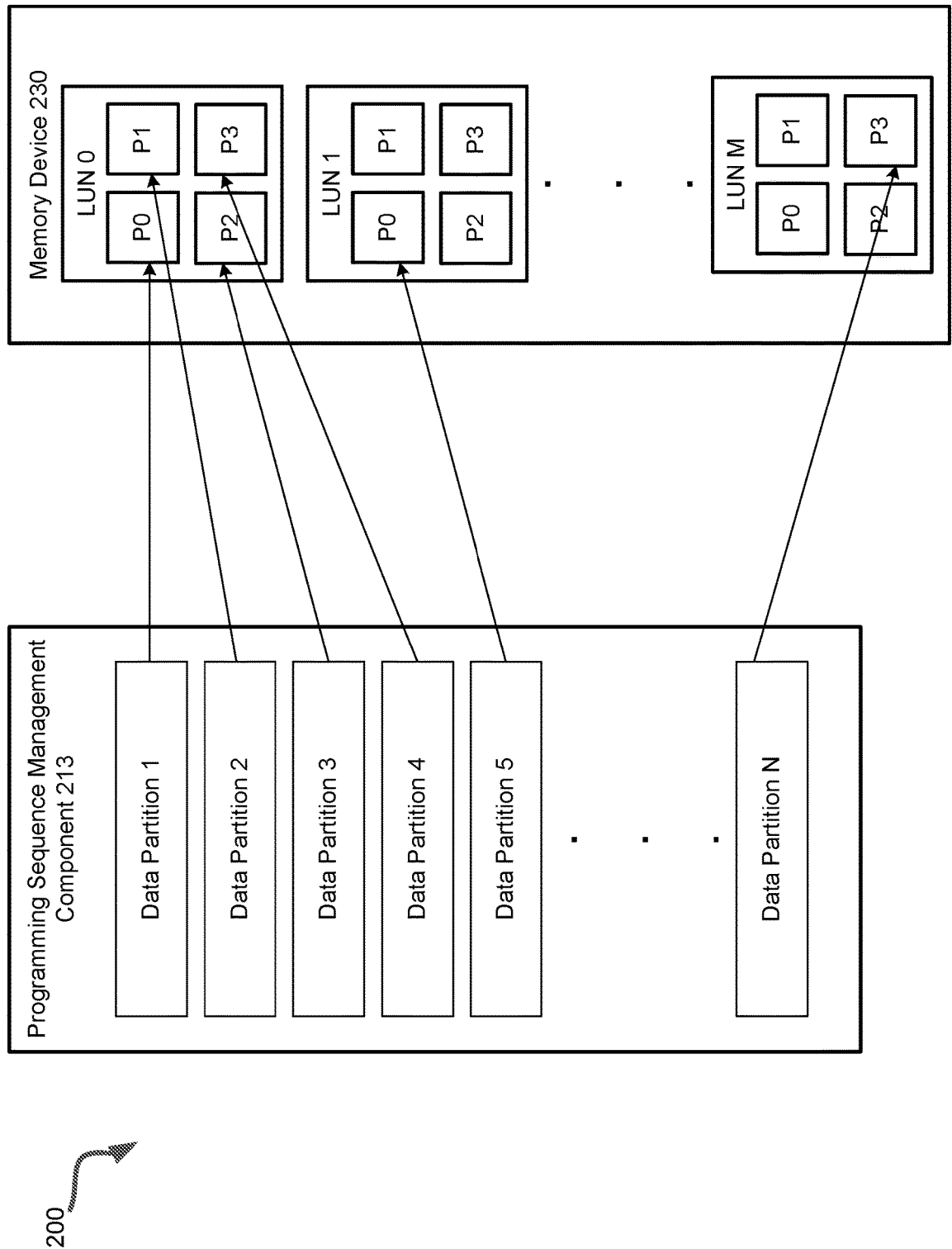
FIG. 2A illustrates an example of a programming sequence used to program host data for charge loss mitigation, in accordance with some embodiments of the present disclosure.

FIG. 2A illustrates an example of a programming sequence used to program host data for charge loss mitigation, in accordance with some embodiments of the present disclosure. As noted herein above and illustrated by FIG. 2A, host data received by a host system, similar to host system 120 of FIG. 1, can be stored on a memory device 230, similar to memory device 130 and/or 140 of FIG. 1, which can include a plurality of logical units (also referred to as "LUNs"). Each LUN 0-M can include multiple blocks that reside on a plurality of planes (e.g., planes P0-P3). Each block can include a plurality of wordlines, as noted above.

The programming sequence management component 213, similar to programming sequence management component 113 of FIG. 1, may partition the host data received from the host system into a plurality of data partitions (e.g., data partition 1-N). As noted above, the programming sequence management component 213 specifies how to program the plurality of data partitions to a plurality of ordered blocks (e.g., the plurality of blocks) distributed across memory device 230 (e.g., LUNs and planes). Accordingly, the programming sequence management component 213 determines whether a plurality of blocks distributed across memory device 230 are empty. Based on determining that the plurality of blocks distributed across memory device 230 are empty, the programming sequence management component 213 may program each data partition of the plurality of data partitions (e.g., data partition 1-N) to a specific wordline (e.g., the first wordline) of each block of the plurality of blocks distributed across memory device 230 in a sequential manner.

For example, the programming sequence management component 113 programs data partition 1 to the specific wordline of a first block of the plurality of blocks located in LUN 0, Plane P0, data partition 2 to the specific wordline of a second block of the plurality of blocks located in LUN 0, Plane P1, data partition 3 to the specific wordline of a third block of the plurality of blocks located in LUN 0, Plane P2, data partition 4 to the specific wordline of a fourth block of the plurality of blocks located in LUN 0, Plane P3, data partition 5 to the specific wordline of a fifth block of the plurality of blocks located in LUN 1, Plane P0, . . . , and data partition N to the specific wordline of an Nth block of the plurality of blocks located in LUN M, Plane P3.

Responsive to receiving a read command from the host system directed to a specific wordline of the plurality of blocks of memory device 230, the programming sequence management component 213 determines whether the specific wordline of the plurality of blocks of memory device 230 is a first wordline of the plurality of blocks of memory device 230. Responsive to determining that the specific wordline is the first wordline of the plurality of blocks of memory device 230, the programming sequence management component 213 reads data from the plurality of specific wordline (e.g., the first wordline) of the plurality of blocks of memory device 230 sequentially, similar to the manner the plurality of data partitions were programmed to the memory device 230. For example, the programming sequence management component 113 reads data partition 1 from the specific wordline of a first block of the plurality of blocks located in LUN 0, Plane P0, data partition 2 from the specific wordline of a second block of the plurality of blocks located in LUN 0, Plane P1, data partition 3 from the specific wordline of a third block of the plurality of blocks located in LUN 0, Plane P2, data partition 4 from the specific wordline of a fourth block of the plurality of blocks located in LUN 0, Plane P3, data partition 5 from the specific wordline of a fifth block of the plurality of blocks located in LUN 1, Plane P0, . . . , and data partition N from the specific wordline of an Nth block of the plurality of blocks located in LUN M, Plane P3.

Figure 2B:
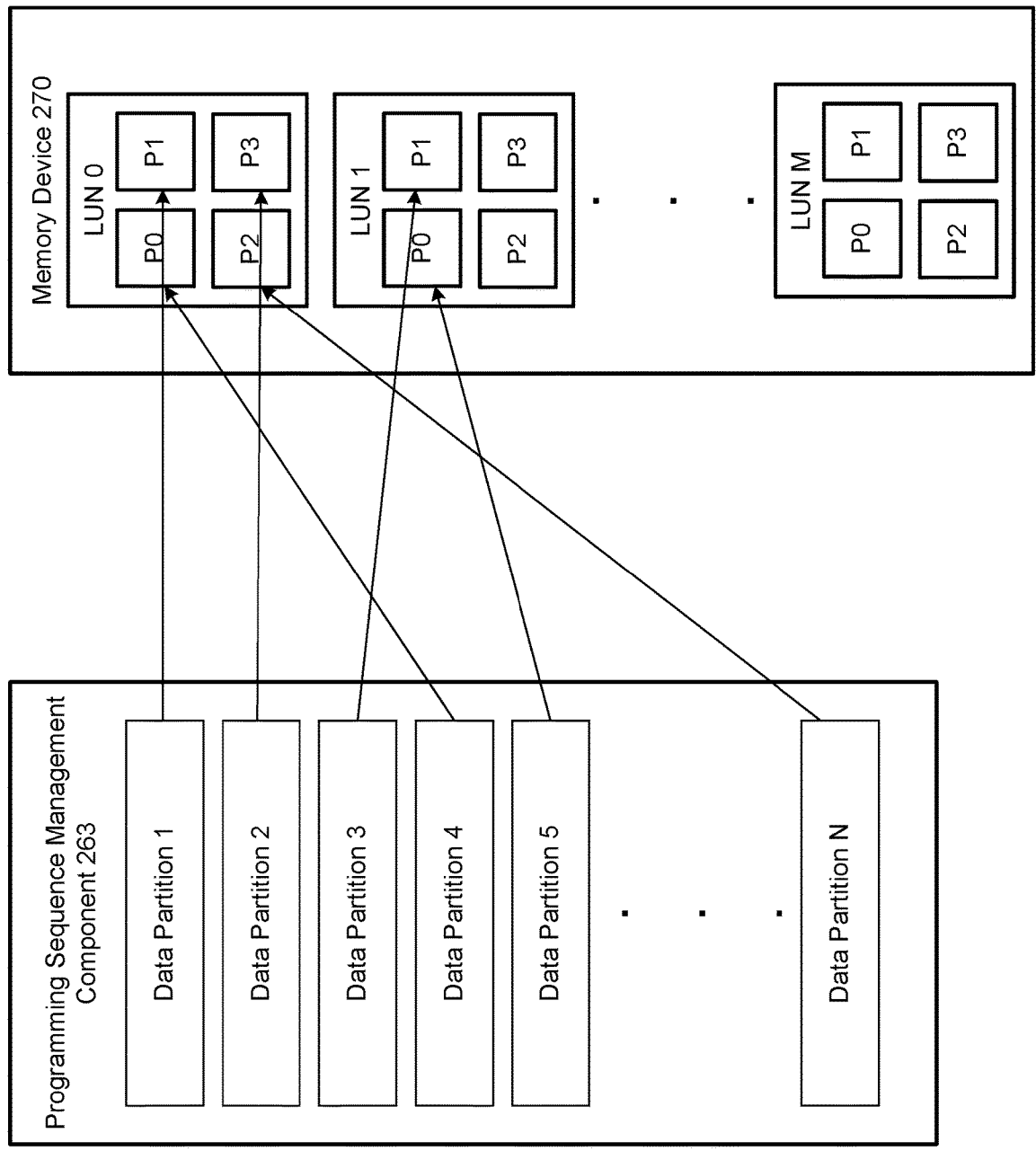
FIG. 2B illustrates another example of a programming sequence used to program host data for charge loss mitigation, in accordance with some embodiments of the present disclosure.

FIG. 2B illustrates an example of a programming sequence used to program host data for charge loss mitigation, in accordance with some embodiments of the present disclosure. As noted herein above and illustrated by FIG. 2B, host data received by a host system, similar to host system 120 of FIG. 1, can be stored on a memory device 270, similar to memory device 130 and/or 140 of FIG. 1, which can include a plurality of logical units (also referred to as "LUNs"). Each LUN 0-M can include multiple blocks on a plurality of planes (e.g., planes P0-P3). Each block can include a plurality of wordlines, as noted above.

The programming sequence management component 263 similar to programming sequence management component 113 of FIG. 1 and programming sequence management component 213 of FIG. 2A, may partition the host data received from the host system into a plurality of data partitions (e.g., data partition 1-N). As noted above, the programming sequence management component 263 specifies how to program the plurality of data partitions to a plurality of ordered blocks (e.g., the plurality of blocks) distributed across memory device 270 (e.g., LUNs and planes). Accordingly, the programming sequence management component 263 determines whether a plurality of blocks distributed across memory device 230 are empty. Based on determining that the plurality of blocks distributed across memory device 230 are not empty, the programming sequence management component 263, for each block, determines the data partition having the lowest respective data state metric to program to a respective block of the plurality of blocks, as previously described.

For example, the programming sequence management component 113 programs data partition 4 to the specific wordline of a first block of the plurality of blocks located in LUN 0, Plane P0, data partition 1 to the specific wordline of a second block of the plurality of blocks located in LUN 0, Plane P1, data partition N to the specific wordline of a third block of the plurality of blocks located in LUN 0, Plane P2, data partition 2 to the specific wordline of a fourth block of the plurality of blocks located in LUN 0, Plane P3, data partition 5 to the specific wordline of a fifth block of the plurality of blocks located in LUN 1, Plane P0, data partition 3 to the specific wordline of a sixth block of the plurality of blocks located in LUN 1, Plane P1, and etc. As previously described, the programming sequence is stored in a programming sequence table for the specific wordline.

Responsive to receiving a read command from the host system directed to a specific wordline of the plurality of blocks of memory device 230, the programming sequence management component 263 determines whether the specific wordline of the plurality of blocks of memory device 230 is a first wordline of the plurality of blocks of memory device 230. Responsive to determining that the specific wordline is not the first wordline of the plurality of blocks of memory device 230, the programming sequence management component 263 identifies the row of the programming sequence table that corresponds to the specific wordline, and then sequentially reads the blocks identified by the entries of the identified table row.

For example, the programming sequence management component 113 reads data partition 1 to the specific wordline of a second block of the plurality of blocks located in LUN 0, Plane P1, data partition 2 to the specific wordline of a fourth block of the plurality of blocks located in LUN 0, Plane P3, data partition 3 to the specific wordline of a sixth block of the plurality of blocks located in LUN 1, Plane P1, data partition 4 to the specific wordline of a first block of the plurality of blocks located in LUN 0, Plane P0, data partition 5 to the specific wordline of a fifth block of the plurality of blocks located in LUN 1, Plane P0, . . . , and data partition N to the specific wordline of a third block of the plurality of blocks located in LUN 0, Plane P2.

Figure 3:
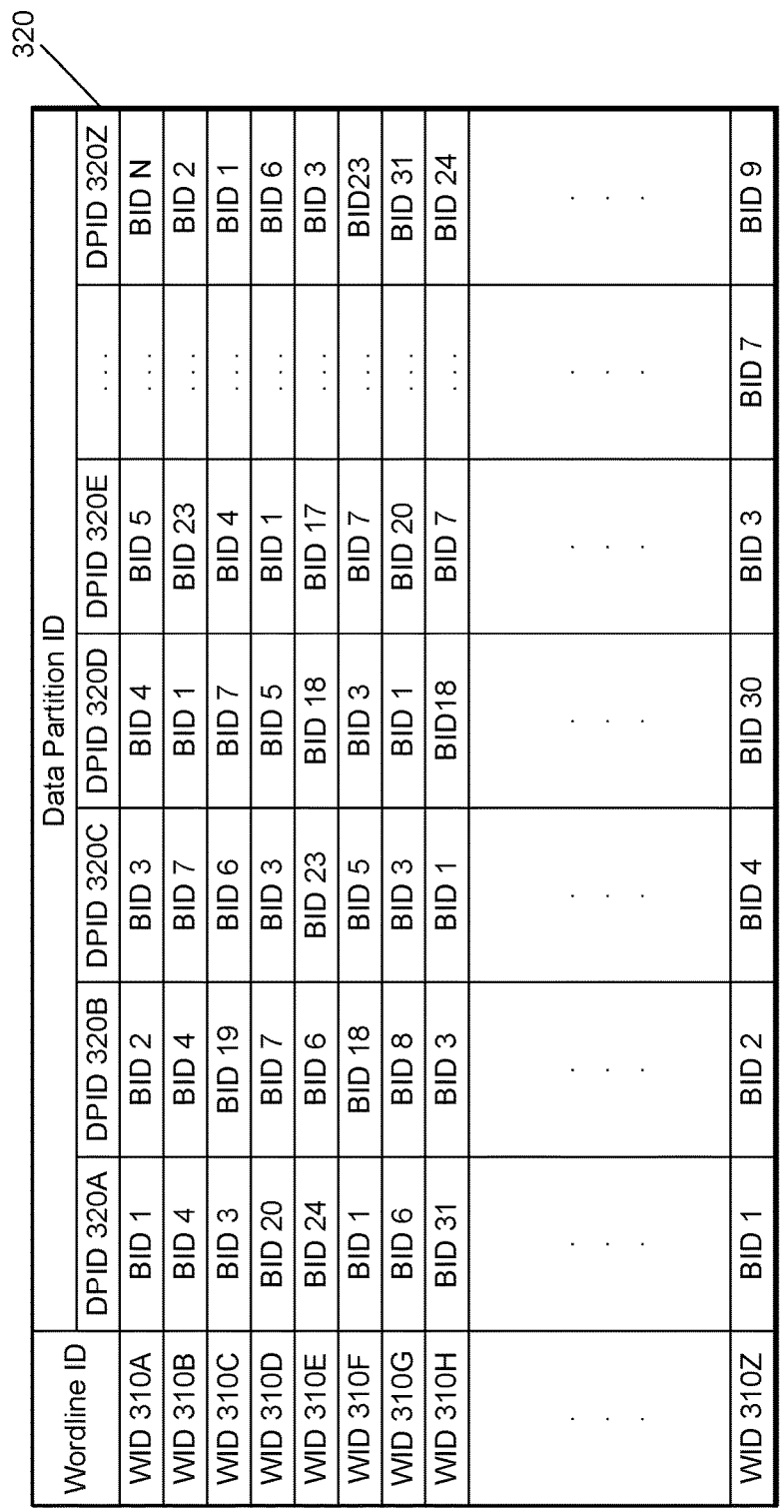
FIG. 3 illustrates an example of a table storing programming sequences for use in charge loss mitigation, in accordance with some embodiments of the present disclosure.

FIG. 3 illustrates an example of a programming sequence table 300 used to manage programming sequences of programmed data, in accordance with some embodiments of the present disclosure. The programming sequence table 300 may be stored in the local memory 119 of the memory sub-system 110. The programming sequence table 300 includes multiple rows identified by wordline ID (e.g., WID 310A-Z). Each wordline ID corresponds to a wordline of the plurality of wordlines distributed across the plurality of blocks. For example, first wordline of the plurality of wordlines corresponds to WID310A, second wordline of the plurality of wordlines corresponds to WID310B, third wordline of the plurality of wordlines corresponds to WID310C, and so on.

The programming sequence table 300 includes multiple columns identified by data partition ID (e.g., DPID 320A-Z). Each data partition ID corresponds to a data partition of the plurality of data partitions of the host data. For example, first data partition of the plurality of data partitions corresponds to DPID 320A, second data partition of the plurality of data partitions corresponds to DPID 320B, third data partition of the plurality of data partitions corresponds to DPID 330A, and so on.

During programming, as noted above, if the plurality of blocks are empty, the programming sequence management component (e.g., programming sequence management component of FIG. 1) stores, for each data partition of the plurality of data partitions (e.g., DPID 320A-Z) programmed to a first wordline of the plurality of wordlines indicated by WID (e.g., WID 310A) of a respective block of the plurality of blocks, a BID associated with the respective block of the plurality of blocks (e.g., BID 1) sequentially. If the plurality of blocks are not empty, the programming sequence management component (e.g., programming sequence management component of FIG. 1) for each data block of the plurality of data blocks, stores in an entry the BID associated with a respective block of the plurality of blocks (e.g., BID 1) in which a data partition of the plurality of data partitions with the lowest respective data state metric (e.g., DPID 320D) is to be programmed to a specific wordline of the plurality of wordlines identified by WID (e.g., WID 310G).

During reading, as noted above, the read command (e.g., read operation) is directed to a specific wordline of the plurality of blocks. If the specific wordline of the plurality of blocks is a first wordline, the programming sequence management component (e.g., programming sequence management component of FIG. 1) reads the host data (e.g., the plurality of data partitions (e.g., DPID 320A-Z)) sequentially from the plurality of the plurality of blocks. In some instances, as described above, the programming sequence may be stored in the programming sequence table. Thus, the programming sequence management component may identify the specific wordline (e.g., the first wordline indicated by WID 310A) and for each data partition ID (e.g., DPID 320A-Z), determine a block of the plurality of blocks to read from based on the BID until each specific wordline of the plurality of blocks is read.

If the specific wordline of the plurality of blocks is not the first wordline, the programming sequence management component (e.g., programming sequence management component of FIG. 1) identifies the row of the programming sequence table 300 that corresponds to the specific wordline, and then sequentially reads the blocks identified by the entries of the identified table row. For example, to read a first data partition of the host data (e.g., DPID 320A) from the specific wordline (e.g., WID 310D), the programming sequence management component obtains from the programming sequence table the BID associated with DPID 320A and WID 310D (e.g., BID 20) and reads from the block of the plurality of blocks associated with BID 20 (e.g., a 20$^{th}$ block of the plurality of blocks located at LUN 5, plane 3), to read a second data partition of the host data (e.g., DPID 320B) from the specific wordline (e.g., WID 310D), the programming sequence management component obtains from the programming sequence table the BID associated with DPID 320B and WID 310D (e.g., BID 7) and reads from the block of the plurality of blocks associated with BID 7 (e.g., a 7$^{th}$ block of the plurality of blocks located at LUN 2, plane 2), and so on.

Figure 4:
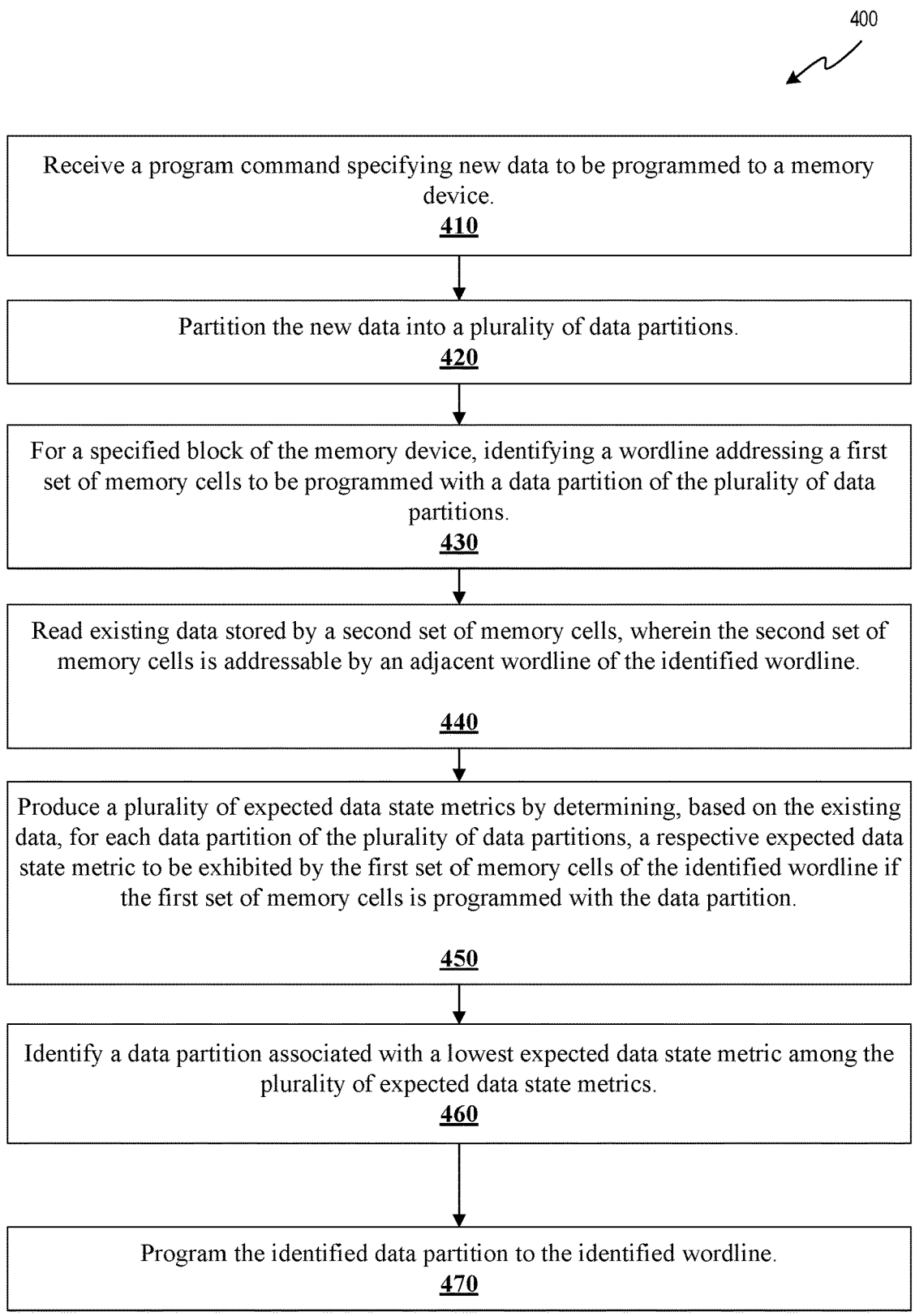
FIG. 4 is a flow diagram of an example method of charge loss mitigation through dynamic programming sequence, in accordance with some embodiments of the present disclosure.

FIG. 4 is a flow diagram of an example method 400 to mitigate charge loss through dynamic programming sequence, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the programming sequence management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic receives a program command specifying new data to be programmed to a memory device. At operation 420, the processing logic partitions the new data into a plurality of data partitions. As previously described, the new data is partitioned (e.g., split) into a plurality of data partitions having a predefined size. Depending on the embodiment, the predefined size may correspond to a page size.

At operation 430, for a specified block of the memory device, the processing logic identifies a wordline addressing a first set of memory cells to be programmed with a data partition of the plurality of data partitions. As previously described, one or more blocks are identified to be programmed with the plurality of data partitions (which may be sequentially ordered or ordered for weakest to strongest). Accordingly, the blocks are iterated through to identify, for each block, the wordline addressing the next set of memory cells to be programmed (i.e., the first erased page or empty page).

At operation 440, the processing logic reads existing data stored by a second set of memory cells, wherein the second set of memory cells is addressable by an adjacent wordline of the identified wordline. Reading existing data stored by a second set of memory cells is performed by the processing logic responsive to determining that the first set of memory cells is not addressable by a first wordline of the specified block.

At operation 450, the processing logic produces a plurality of expected data state metrics by determining, based on the existing data, for each data partition of the plurality of data partitions, a respective expected data state metric to be exhibited by the first set of memory cells of the identified wordline if the first set of memory cells is programmed with the data partition. To produce the plurality of expected data state metrics, the processing logic, for each bitline of a plurality of bitlines intersecting the adjacent wordline and the identified wordline, determines, from a charge loss data structure, a data state metric. The charge loss data structure comprises a plurality of entries each comprising a data state metric associated with applying a first threshold voltage to the identified wordline and a second threshold voltage to the adjacent wordline. The processing logic then obtains the expected data state metric based on a sum of each data state metric associated with each bitline of the plurality of bitlines intersecting the identified wordline and the adjacent wordline. The data state metric is a bit error count.

At operation 460, the processing logic identifies a data partition associated with a lowest expected data state metric among the plurality of expected data state metrics. At operation 470, the processing logic programs the identified data partition to the identified wordline. In some embodiments, the processing logic stores, in an entry of a plurality of entries of a programming sequence data structure, an identifier of the specified block associated with the identified wordline. The entry of the plurality of entries is identified by the identified wordline and the data partition associated with the lowest expected data state metric.

Depending on the embodiment, responsive to determining that the first set of memory cells is addressable by a first wordline of the specified block, the processing logic programs a first data partition of the plurality of data partitions to the identified wordline. In particular, rather than programming the identified data partition to the identified wordline, the processing logic programs each of data partition of the plurality of data partitions, one by one sequentially, to a plurality of blocks of the memory device. Responsive to programming the each data partition to the first wordline, the processing logic stores, in an entry of a plurality of entries of a programming sequence data structure, an identifier of each block associated with the first wordline. The entry of the plurality of entries is identified by the first wordline and each data partition programmed in sequence.

In some embodiments, the processing logic receives a read command specifying a target wordline addressing a third set of memory cells to read a specified data partition of the plurality of data partitions. Responsive to determining that the target wordline is a set of memory cells addressable by a first wordline, the processing logic reads the specified data partition from the target wordline of a first block of a plurality of blocks of the memory device. Responsive to determining that the target wordline is not the set of memory cells addressable by the first wordline, the processing logic reads the specified data partition from the target wordline of a block of a plurality of blocks obtained from the programming sequence data structure. To read the specified data partition from the target wordline of a block of a plurality of blocks obtained from the programming sequence data structure, the processing logic identifies identifying, among the plurality of entries of the programming sequence data structure, the block of the plurality of blocks based on the specified data partition (e.g., an data partition identification associated with the specified data partition) and the target wordline (e.g., a wordline identification associated with the target wordline).

Figure 5:
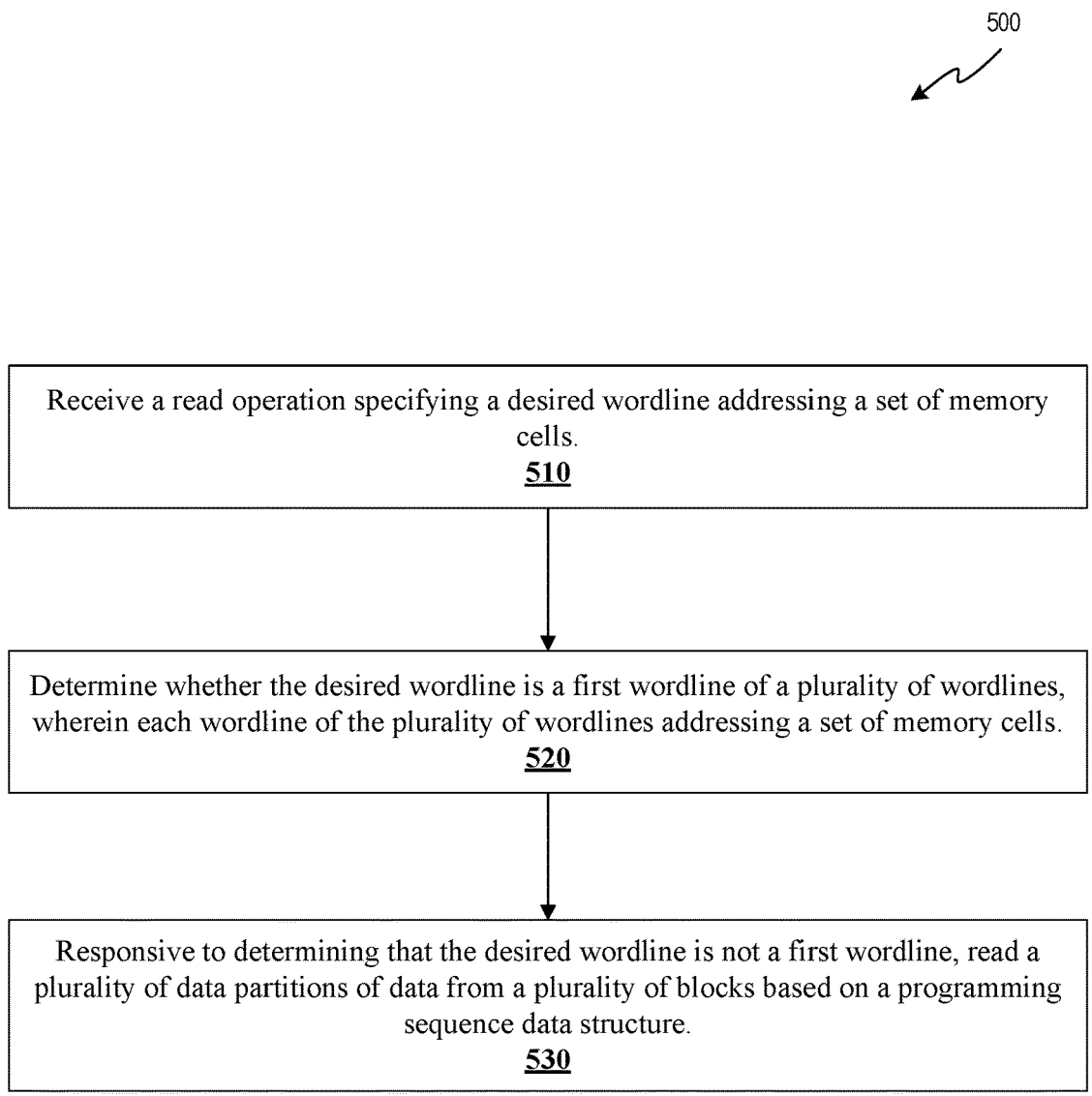
FIG. 5 is a flow diagram of an example method of charge loss mitigation through dynamic programming sequence, in accordance with some embodiments of the present disclosure.

FIG. 5 is a flow diagram of an example method 500 to mitigate charge loss through dynamic programming sequence, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the programming sequence management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic receives a read operation specifying a desired wordline addressing a set of memory cells. At operation 520, the processing logic determines whether the desired wordline is a first wordline of a plurality of wordlines. Each wordline of the plurality of wordlines addressing a set of memory cells.

At operation 530, responsive to determining that the desired wordline is not a first wordline of the ordered set of consecutive wordlines, the processing logic reads a plurality of data partitions of data from a plurality of blocks based on a programming sequence data structure. As previously described, using the programming sequence table, the processing logic iterates through a plurality of data partition identification sequentially at a wordline identification associated with the specific wordline and obtains, from the intersection of the wordline identification associated with specified wordline and a respective data partition identification, a block identification to read a portion of data corresponding to the read command from a block corresponding to the block identification (i.e., a LUN and plane indicated by the block identification). In some embodiments, responsive to determining that the desired wordline is the first wordline, the processing logic reads the plurality of data partitions of data sequentially from the plurality of blocks or using the programming sequence table, the processing logic iterates through a plurality of data partition identification sequentially at a wordline identification associated with the specific wordline and obtains, from the intersection of the wordline identification associated with specified wordline and a respective data partition identification, a block identification to read a portion of data corresponding to the read command from a block corresponding to the block identification (i.e., a LUN and plane indicated by the block identification).

The programming sequence data structure is a plurality of entries. Each entry is identified by a wordline and a data partition of a plurality of data partitions. Each entry includes a block value indicating a block containing the a portion of data associated with the data partition. Depending on the embodiment, determining the block value for the entry of the plurality of entries, the processing logic receives a program command specifying data to be programmed.

For a specified block of a memory device, the processing logic identifies a wordline addressing a first set of memory cells to be programmed with a data partition of the plurality of data partitions. The processing logic then reads previously stored data stored by a second set of memory cells, wherein the second set of memory cells is addressable by an adjacent wordline of the identified wordline. The processing logic produces a plurality of expected data state metrics by determining, based on previously stored data, for each data partition of the plurality of data partitions, a respective expected data state metric to be exhibited by the first set of memory cells of the identified wordline if the first set of memory cells is programmed with the data partition. The processing logic then identifies a data partition associated with a lowest expected data state metric among the plurality of expected data state metrics. The processing logic programs the identified data partition to the identified wordline. The processing logic stores the block value (e.g., an identifier of the block) in an entry of the programming sequence data structure based on the identified data partition and the identified wordline.

Figure 6:
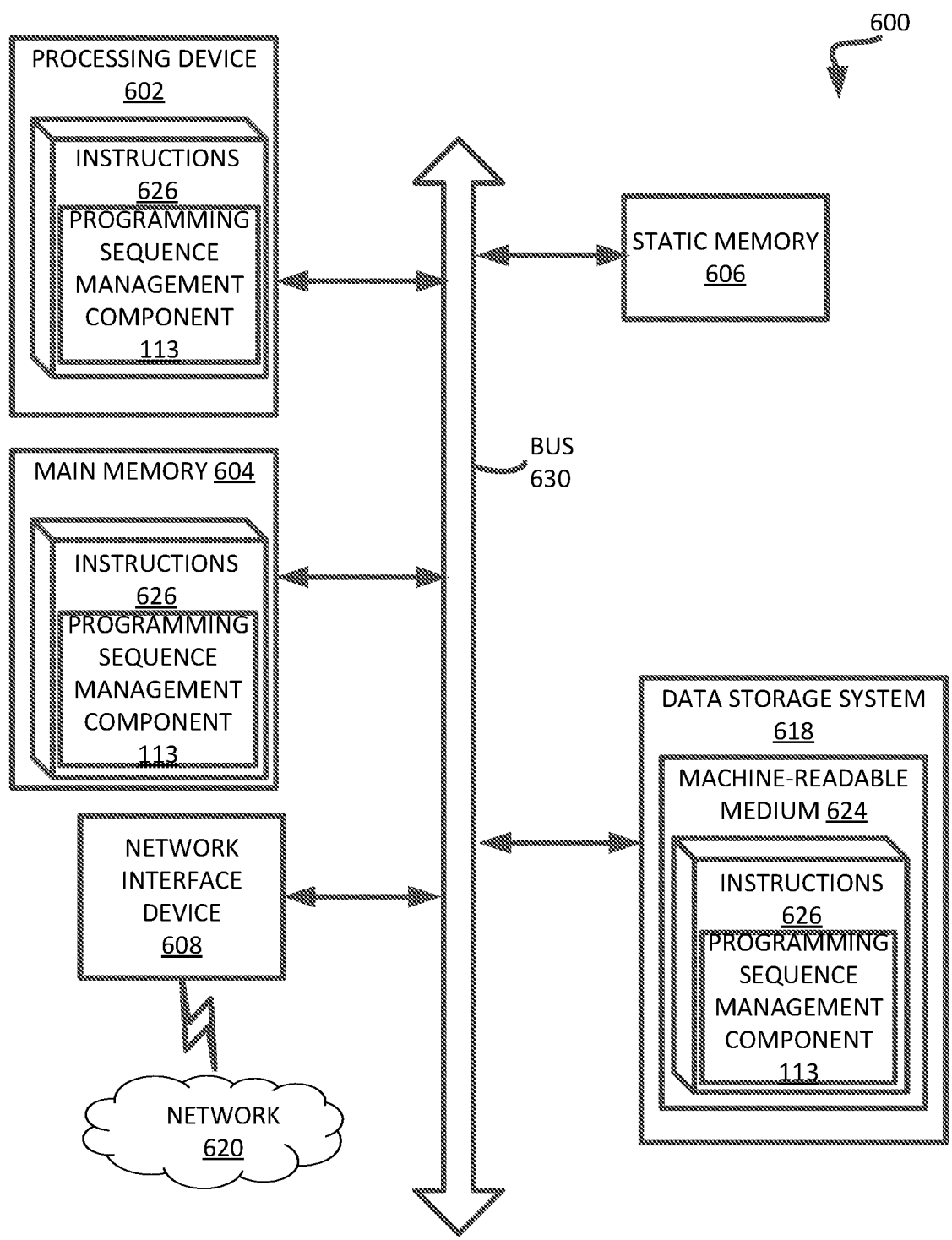
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the programming sequence management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a Scan management component (e.g., the programming sequence management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving a program command specifying new data to be programmed to a memory device;
partitioning the new data into a plurality of data partitions;
for a specified block of the memory device, identifying a wordline addressing a first set of memory cells to be programmed with a data partition of the plurality of data partitions;
reading existing data stored by a second set of memory cells, wherein the second set of memory cells is addressable by an adjacent wordline of the identified wordline;
for each data partition of the plurality of data partitions and based on the existing data, producing a plurality of expected data state metrics by determining a respective expected data state metric exhibited by the first set of memory cells of the identified wordline if the first set of memory cells is programmed with the data partition;
identifying a data partition associated with a lowest expected data state metric among the plurality of expected data state metrics; and
programming the identified data partition to the identified wordline.

2. The method of claim 1, wherein reading existing data stored by the second set of memory cells is performed responsive to determining that the first set of memory cells is not addressable by a first wordline of the specified block.

3. The method of claim 1, further comprising:
responsive to determining that the first set of memory cells is addressable by a first wordline of the specified block, programming a first data partition of the plurality of data partitions to the identified wordline.

4. The method of claim 1, further comprising:
storing, in an entry of a plurality of entries of a programming sequence data structure, an identifier of the specified block associated with the identified wordline, wherein the entry of the plurality of entries is associated with the identified wordline and the data partition.

5. The method of claim 4, further comprising:
receiving a read command specifying a target wordline addressing a third set of memory cells to read a specified data partition of the plurality of data partitions; and
reading the specified data partition from the target wordline of a block of a plurality of blocks identified by the programming sequence data structure.

6. The method of claim 5, wherein reading the specified data partition further comprises:
identifying, among the plurality of entries of the programming sequence data structure, the block of the plurality of blocks based on the specified data partition and the target wordline.

7. The method of claim 1, wherein the data state metric is a bit error count.

8. A system comprising:
a memory device, and
a processing device, operatively coupled with the memory device, to perform operations comprising:
receiving a program command specifying new data to be programmed to the memory device;
partitioning the new data into a plurality of data partitions;
for a specified block of the memory device, identifying a wordline addressing a first set of memory cells to be programmed with a data partition of the plurality of data partitions;
reading existing data stored by a second set of memory cells, wherein the second set of memory cells is addressable by an adjacent wordline of the identified wordline;
for each data partition of the plurality of data partitions and based on the existing data, producing a plurality of expected data state metrics by determining a respective expected data state metric exhibited by the first set of memory cells of the identified wordline if the first set of memory cells is programmed with the data partition;
identifying a data partition associated with a lowest expected data state metric among the plurality of expected data state metrics; and
programming the identified data partition to the identified wordline.

9. The system of claim 8, wherein reading existing data stored by the second set of memory cells is performed responsive to determining that the first set of memory cells is not addressable by a first wordline of the specified block.

10. The system of claim 8, wherein the processing device is to further perform operations comprising:
responsive to determining that the first set of memory cells is addressable by a first wordline of the specified block, programming a first data partition of the plurality of data partitions to the identified wordline.

11. The system of claim 8, wherein the processing device is to further perform operations comprising:
storing, in an entry of a plurality of entries of a programming sequence data structure, an identifier of the specified block associated with the identified wordline, wherein the entry of the plurality of entries is associated with the identified wordline and the data partition.

12. The system of claim 11, wherein the processing device is to further perform operations comprising:
receiving a read command specifying a target wordline addressing a third set of memory cells to read a specified data partition of the plurality of data partitions; and
reading the specified data partition from the target wordline of a block of a plurality of blocks identified by the programming sequence data structure.

13. The system of claim 12, wherein reading the specified data partition from the target wordline of a block of a plurality of blocks obtained from the programming sequence data structure comprises:
identifying, among the plurality of entries of the programming sequence data structure, the block of the plurality of blocks based on the specified data partition and the target wordline.

14. The system of claim 9, wherein the data state metric is a bit error count.

15. A non-transitory computer-readable storage medium comprising instructions that, when executed by a processing device, cause the processing device to perform operations comprising:
receiving a program command specifying new data to be programmed to a memory device;
partitioning the new data into a plurality of data partitions;
for a specified block of the memory device, identifying a wordline addressing a first set of memory cells to be programmed with a data partition of the plurality of data partitions;
reading existing data stored by a second set of memory cells, wherein the second set of memory cells is addressable by an adjacent wordline of the identified wordline;
for each data partition of the plurality of data partitions and based on the existing data, producing a plurality of expected data state metrics by determining a respective expected data state metric exhibited by the first set of memory cells of the identified wordline if the first set of memory cells is programmed with the data partition;
identifying a data partition associated with a lowest expected data state metric among the plurality of expected data state metrics; and
programming the identified data partition to the identified wordline.

16. The non-transitory computer-readable storage medium of claim 15, wherein reading existing data stored by the second set of memory cells is performed responsive to determining that the first set of memory cells is not addressable by a first wordline of the specified block.

17. The non-transitory computer-readable storage medium of claim 15, further causing the processing device to perform operations comprising:
responsive to determining that the first set of memory cells is addressable by a first wordline of the specified block, programming a first data partition of the plurality of data partitions to the identified wordline.

18. The non-transitory computer-readable storage medium of claim 15, further causing the processing device to perform operations comprising:
storing, in an entry of a plurality of entries of a programming sequence data structure, an identifier of the specified block associated with the identified wordline, wherein the entry of the plurality of entries is associated with the identified wordline and the data partition.

19. The non-transitory computer-readable storage medium of claim 18, further causing the processing device to perform operations comprising:
receiving a read command specifying a target wordline addressing a third set of memory cells to read a specified data partition of the plurality of data partitions; and reading the specified data partition from the target wordline of a block of a plurality of blocks identified by the programming sequence data structure.

20. The non-transitory computer-readable storage medium of claim 15, wherein the data state metric is a bit error count.

* * * * *